United States Patent
Yoo et al.

(10) Patent No.: US 9,520,427 B1
(45) Date of Patent: Dec. 13, 2016

(54) IMAGE SENSOR INCLUDING VERTICAL TRANSFER GATE AND METHOD FOR FABRICATING THE SAME

(71) Applicant: SK hynix Inc., Gyeonggi-do (KR)

(72) Inventors: Kyungdong Yoo, Gyeonggi-do (KR); Kyoung-In Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/060,160

(22) Filed: Mar. 3, 2016

(30) Foreign Application Priority Data

Sep. 16, 2015 (KR) .................. 10-2015-0130812

(51) Int. Cl.
| | | |
|---|---|---|
| *H01L 27/00* | (2006.01) | |
| *H01L 27/146* | (2006.01) | |
| *H04N 5/378* | (2011.01) | |
| *H04N 5/376* | (2011.01) | |

(52) U.S. Cl.
CPC ... *H01L 27/14616* (2013.01); *H01L 27/14601* (2013.01); *H01L 27/14605* (2013.01); *H01L 27/14621* (2013.01); *H01L 27/14636* (2013.01); *H01L 27/14643* (2013.01); *H01L 27/14645* (2013.01); *H04N 5/378* (2013.01); *H04N 5/3765* (2013.01)

(58) Field of Classification Search
CPC ............ H01L 27/14643; H01L 27/14601; H01L 27/14645; H01L 27/14621
See application file for complete search history.

(56) References Cited

U.S. PATENT DOCUMENTS

| | | | |
|---|---|---|---|
| 2013/0040415 A1* | 2/2013 | Arakawa | H01L 27/14627 438/68 |
| 2014/0016012 A1* | 1/2014 | Oishi | H04N 5/372 348/311 |
| 2014/0211056 A1 | 7/2014 | Fan | |
| 2014/0264508 A1 | 9/2014 | Kao et al. | |
| 2015/0029374 A1 | 1/2015 | Kitano | |
| 2015/0035103 A1* | 2/2015 | Inoue | H01L 27/1464 257/432 |
| 2016/0088243 A1* | 3/2016 | Higashi | H04N 5/341 348/294 |

FOREIGN PATENT DOCUMENTS

KR 1020110018104 2/2011

* cited by examiner

*Primary Examiner* — Ngan Ngo
(74) *Attorney, Agent, or Firm* — IP & T Group LLP

(57) ABSTRACT

Provided is an image sensor having improved characteristics. An image sensor in accordance with an embodiment of the present invention may include a photoelectric conversion element formed in a substrate; a transfer gate formed over the photoelectric conversion element, formed over a first surface of the substrate and having at least one through hole, wherein the through hole passes through the transfer gate; a floating diffusion layer formed over the transfer gate; a channel structure formed in the through hole and electrically coupling the photoelectric conversion element to the floating diffusion layer in response to a signal applied to the transfer gate; and a capacitor formed over the floating diffusion layer.

20 Claims, 14 Drawing Sheets

IMAGE SENSOR INCLUDING VERTICAL TRANSFER GATE AND METHOD FOR FABRICATING THE SAME

CROSS-REFERENCE TO RELATED APPLICATIONS

The present application claims priority of Korean Patent Application No. 10-2015-0130812, filed on Sep. 16, 2015, which is herein incorporated by reference in its entirety.

BACKGROUND

Exemplary embodiments of the present invention relate to a semiconductor device manufacturing technology, and more particularly, to an image sensor including a vertical transfer gate and a method for fabricating the same.

An image sensor converts an optical image into electrical signals. Due to the development of the computer industry and the communication industry, the demand for image sensors with improved performance has increased in various fields such as digital cameras, camcorders, personal communication systems (PCS), game machines, security cameras, medical micro-cameras, and robots.

SUMMARY

Various embodiments are directed to an image sensor having improved performance and a method for fabricating the same.

In an embodiment, an image sensor may include a photoelectric conversion element formed in a substrate; a transfer gate formed over the photoelectric conversion element, formed over a first surface of the substrate, and having at least one through hole, wherein the through hole passes through the transfer gate; a floating diffusion layer formed over the transfer gate; a channel structure formed in the through hole and electrically coupling the photoelectric conversion element to the floating diffusion layer in response to a signal applied to the transfer gate; and a capacitor formed over the floating diffusion layer.

Moreover, the image sensor may further include an interlayer dielectric layer formed over the substrate and covering the transfer gate, the floating diffusion layer, and the capacitor; a logic circuit layer formed over the interlayer dielectric layer; and contacts passing through the interlayer dielectric layer and electrically coupling the transfer gate, the floating diffusion layer, and the capacitor to the logic circuit layer, respectively.

Further, the image sensor may further include a color filter layer formed over an incident surface of the substrate, wherein the incident surface of the substrate is opposite to the first surface of the substrate, an incident light is introduced into the photoelectric conversion element through the incident surface; and a light condensing member formed over the color filter layer.

The photoelectric conversion element may include a second impurity region formed in the substrate; and a first impurity region having a conductivity type complementary to the second impurity region, formed in the substrate, and surrounding the second impurity region, wherein the second impurity region extends to the channel structure by passing through the first impurity region.

The photoelectric conversion element may further include a third impurity region formed in the substrate, having the same conductive type as the first impurity region, and interposed between the channel structure and the second impurity region. The first impurity region may include a portion provided between the second impurity region with the transfer gate, and wherein the third impurity region may have a smaller thickness than the portion of the first impurity region which is provided between the second impurity region with the transfer gate. A doping concentration of the second impurity region may increase along a carrier transfer direction. The transfer gate may include a gate electrode; and a gate dielectric layer surrounding the gate electrode.

The gate dielectric layer may include a first gate dielectric layer formed between the gate electrode and the photoelectric conversion element; a second gate dielectric layer formed between the gate electrode and the floating diffusion layer; and a third gate dielectric layer formed between the channel structure and the gate electrode. The first gate dielectric layer, the second gate dielectric layer, and the third gate dielectric layer may have the same thickness as each other. Each of the first gate dielectric layer and the second gate dielectric layer may have a larger thickness than the third gate dielectric layer.

Each of the first gate dielectric layer and the second gate dielectric layer may include a low-K material, and wherein the third gate dielectric layer may include a high-K material. The channel structure may include a channel layer formed over a sidewall of the through hole; and a sealing layer surrounded by through hole. The through hole may have a polygon pillar shape or a round pillar shape. The channel layer may have a ring-type column shape or a cylinder shape. The channel structure may include a channel layer having a column shape and is formed so as to fill the through hole completely. Each of the transfer gate and the floating diffusion layer may have a flat plate shape, and wherein the transfer gate may have a larger area than the floating diffusion layer.

The image sensor may further include a second through hole, wherein the second through hole passes through the transfer gate, and wherein the floating diffusion layer overlaps the through hole. The capacitor may include a stack of a first electrode, a dielectric layer, and a second electrode, and wherein the first electrode may include the floating diffusion layer. Each of the floating diffusion layer and the capacitor may have a flat plate shape, and wherein the floating diffusion layer may have a larger area than the dielectric layer and the second electrode.

In an embodiment, a method for fabricating an image sensor may include forming a photoelectric conversion element in a substrate; forming a transfer gate over the photoelectric conversion element and over a first surface of the substrate; forming at least one through hole passing through the transfer gate; forming a channel structure in the through hole; forming a floating diffusion layer over the transfer gate, wherein the floating diffusion layer overlaps the channel structure; and forming a capacitor over the floating diffusion layer.

Further, the method may further include forming an interlayer dielectric layer over the substrate, wherein the interlayer dielectric layer covers the transfer gate, the floating diffusion layer, and the capacitor; forming contacts each passing through the interlayer dielectric layer and respectively coupled to the transfer gate, the floating diffusion layer, and the capacitor; and forming a logic circuit layer over the interlayer dielectric layer. The forming the logic circuit layer may include forming a logic circuit layer over a carrier wafer; and bonding the logic circuit layer to the interlayer dielectric layer by a wafer bonding process.

Moreover, the method may further include forming a color filter layer over an incident surface of the substrate, wherein the incident surface is located opposite to the first surface of the substrate, wherein an incident light is introduced into the photoelectric conversion element through the incident surface; and forming a light condensing member over the color filter layer.

The forming the photoelectric conversion element in the substrate may include forming a first impurity region by ion-implanting an impurity having a first conductivity type in the substrate; and forming a second Impurity region by ion-implanting an impurity having a second conductivity type complementary to the first conductivity type so that the first impurity region surrounds the second impurity region. The method may further include after forming the transfer gate, ion-implanting an impurity having the second conductivity type in the first impurity region exposed by the through hole to form an expanded region, and wherein the second impurity region is coupled to a bottom surface of the through hole via the expanded region.

The method may further include forming a third impurity region between the through holes and the expanded region by ion-implanting an impurity having the first conductivity type in the expanded region. The third impurity region may have a smaller thickness than the first impurity region which is located between the transfer gate and the second impurity region. The forming the transfer gate may include forming a stack layer over the photoelectric conversion element, wherein the stack layer includes a first dielectric layer, a gate conductive layer, and a second dielectric layer; forming the through hole in the stack layer by selectively etching the stack layer; and forming a third gate dielectric layer over a sidewall of the through hole.

The first gate dielectric layer, the second gate dielectric layer, and the third gate dielectric layer may have the same thickness as each other. Each of the first gate dielectric layer and the second gate dielectric layer may have a larger thickness than the third gate dielectric layer. Each of the first gate dielectric layer and the second gate dielectric layer may include a low-K material, and wherein the third gate dielectric layer may include a high-K material.

The forming the channel structure may include forming a channel conductive layer filling in the through hole; and forming a channel layer by selectively etching the channel conductive layer. The channel layer may have a ring-type column shape or a cylinder shape.

The method may further include forming a sealing layer in the through hole, wherein the sealing layer is surrounded by the channel layer. The channel layer may have a column shape and is formed so as to fill the through hole completely. Each of the transfer gate and the floating diffusion layer may have a flat plate shape, and wherein the transfer gate may have a larger area than the floating diffusion layer. The floating diffusion layer may overlap the through hole. The capacitor may include a stack of a first electrode, a dielectric layer, and a second electrode, and wherein the first electrode may include the floating diffusion layer. Each of the floating diffusion layer and the capacitor may have a flat plate shape, and wherein the floating diffusion layer may have a larger area than the dielectric layer and the second electrode.

DETAILED DESCRIPTION

Figure 1:
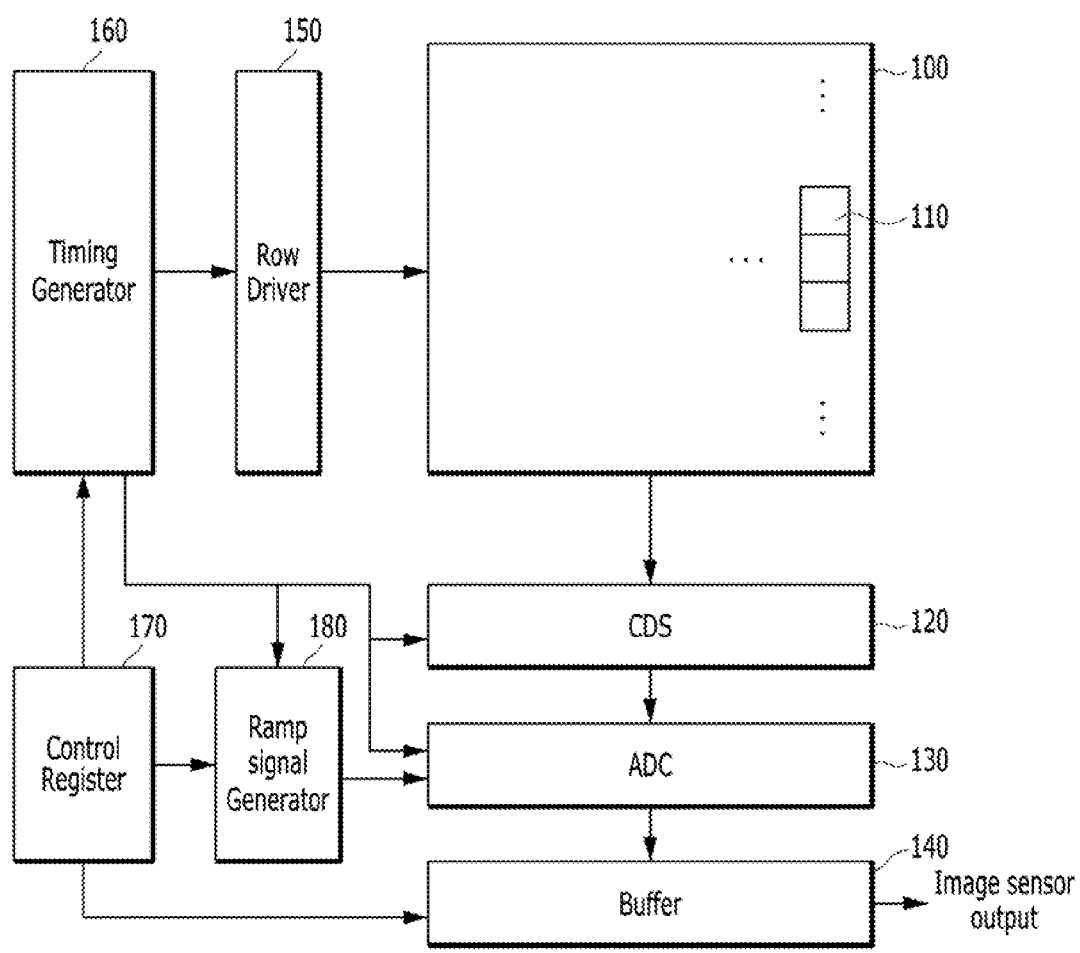
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

The following embodiments of the present invention provide an image sensor having improved performance and a method for fabricating the same. The image sensor having improved performance means an image sensor capable of providing a high resolution image. Since an Image sensor including a plurality of highly integrate pixels is required to provide a high resolution image, in the image sensor in accordance with the embodiments, each of a plurality of pixels may include a transfer transistor including a vertical transfer gate, and have a shape in which the transfer transistor and a photoelectric conversion element are stacked.

FIG. 1 is a block diagram schematically illustrating an image sensor in accordance with an embodiment of the present invention.

As illustrated in FIG. 1, the image sensor may include a pixel array 100, a correlated double sampling (CDS) unit 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160, and the buffer 140.

The row driver 150 may drive the pixel array 100 row by row. For example, the row driver 150 may generate a select signal for selecting any one row line of a plurality of row lines. Each of the unit pixels 110 may sense incident light and output an image reset signal and an image signal to the CDS unit 120 through a column line. The CDS unit 120 may perform sampling on the image reset signal and the image signal.

The ADC 130 may compare a ramp signal outputted from the ramp signal generator 180 with a sampling signal outputted from the CDS unit 120, and output a comparison signal. According to a clock signal provided from the timing generator 160, the ADC 130 may count the level transition time of the comparison signal, and output the count value to the buffer 140. The ramp signal generator 180 may operate under control of the timing generator 160.

The buffer 140 may store a plurality of digital signals outputted from the ADC 130 then sense and amplify the digital signals. Thus, the buffer 140 may include a memory (not illustrated) and a sense amplifier (not Illustrated). The memory may store count values. The count values may represent signals outputted from the plurality of unit pixels 110. The sense amplifier may sense and amplify the count values outputted from the memory.

In order to provide a high resolution image, the number of unit pixels 110 integrated in a pixel array 100 should be inevitably increased. That is, more unit pixels 110 should be disposed in a limited area and thus, a physical size of unit pixel 110 should be decreased. However, since the image sensor operates on a basis of a pixel signal generated by each unit pixel in response to an incident light, if the physical size of unit pixel 110 is decreased, characteristics of the unit pixel 110 are deteriorated.

Therefore, in following embodiment in accordance with the present invention, an image sensor capable of facilitating high integration and preventing deterioration of characteristics due to an increase in integration degree will be described in detail with reference to drawings.

Figure 2:
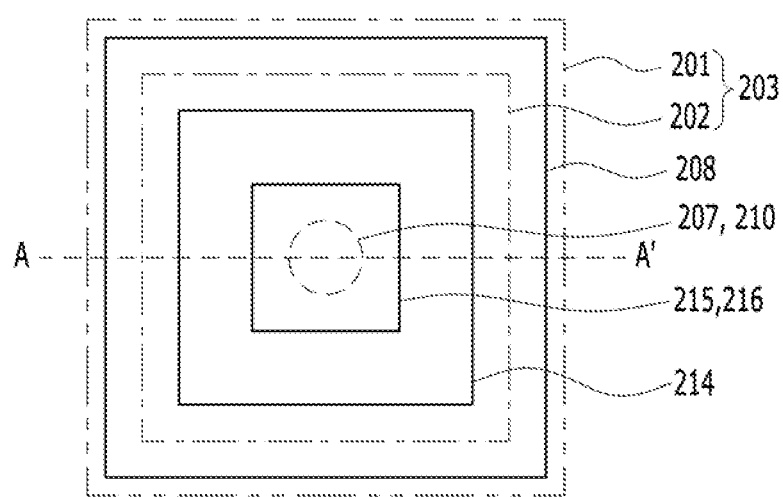
FIG. 2 is a plan view illustrating an image sensor in accordance with an embodiment of the present invention.
Figure 3:
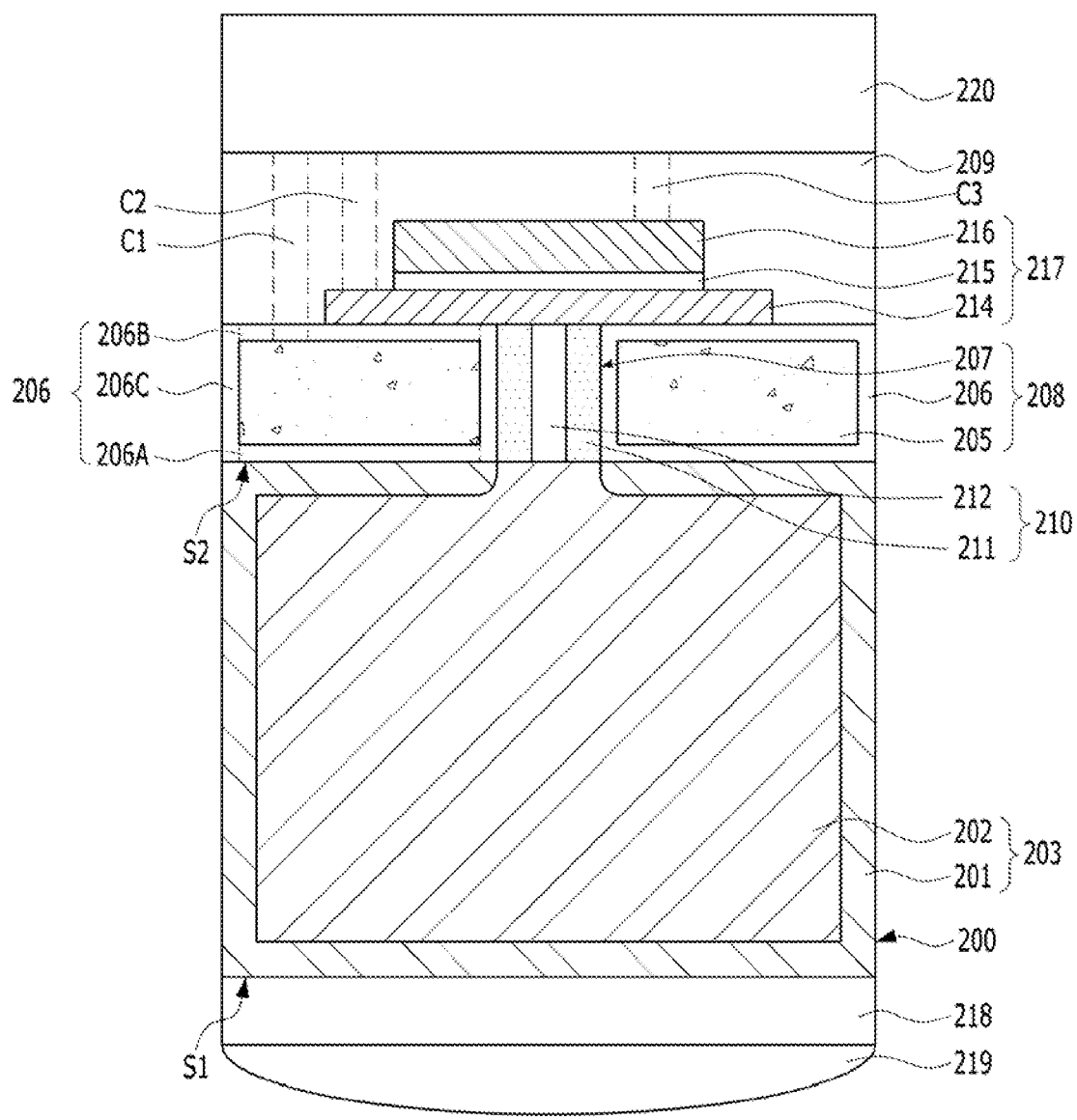
FIG. 3 is a cross-sectional view illustrating an image sensor in accordance with an embodiment of the present invention and taken along the line A-A' shown in FIG. 2.
Figure 4:
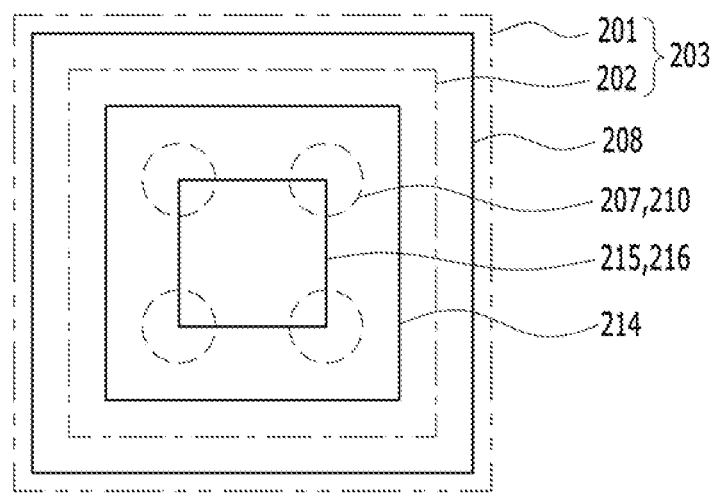
FIG. 4 is a plan view illustrating an image sensor in accordance with another embodiment of the present invention.
Figure 5A:
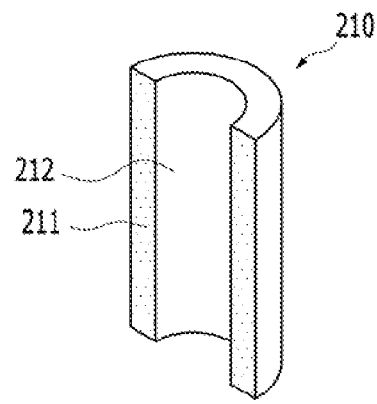
FIGS. 5A to 5C are perspective views illustrating a channel structure applicable to an image sensor in accordance with an embodiment of the present invention.
Figure 5B:
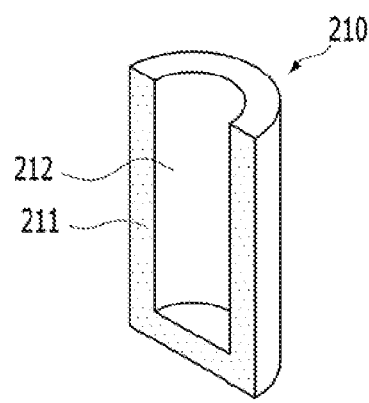
Figure 5C:
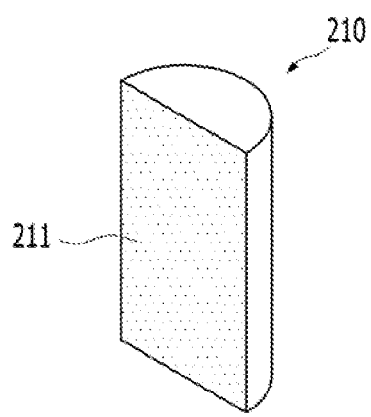

FIG. 2 is a plan view illustrating an image sensor in accordance with an embodiment of the present invention, and FIG. 3 is a cross-sectional view illustrating an image sensor in accordance with an embodiment of the present invention and taken along the line A-A' shown in FIG. 2. FIG. 4 is a plan view illustrating an image sensor in accordance with another embodiment of the present invention. FIGS. 5A to 5C are perspective views illustrating a channel structure applicable to an image sensor in accordance with an embodiment of the present invention.

As shown in FIGS. 2 and 3, an image sensor in accordance with an embodiment may include a photoelectric conversion element 203 formed in a substrate 200, a transfer gate 208 formed over the photoelectric conversion element 203 and having one or more through holes 207 passing through the transfer gate 208, a floating diffusion layer 214 formed over the transfer gate 208, a channel structure 210 gap-filling each of the one or more through holes 207 and electrically coupling the photoelectric conversion element 203 to the floating diffusion layer 214 in response to a signal applied to the transfer gate 208, and a capacitor 217 formed over the floating diffusion layer 214.

Moreover, the image sensor may include an Interlayer dielectric layer 209 formed over the substrate 200 and covering the transfer gate 208, the floating diffusion layer 214 and a capacitor 217, a logic circuit layer 220 formed over the interlayer dielectric layer 209 and contacts C1, C2 and C3 passing through the interlayer dielectric layer 209 and electrically coupling each of the transfer gate 208, the floating diffusion layer 214 and the capacitor 217 to the logic circuit layer 220. Further, the image sensor may include a color filter layer 218 opposite to the transfer gate 208 and formed over an incident surface S1 where an incident light is introduced into the photoelectric conversion element 203, and a light condensing member 219 formed over the color filter layer 218.

Hereinafter, each of the components will be described in detail. The image sensor in accordance with the embodiment of the present Invention may include the photoelectric conversion element 203 formed in the substrate 200. The substrate 200 may include a semiconductor substrate. The semiconductor substrate may be in a single crystal state and include a silicon-containing material. That is, the substrate 200 may include a single crystal silicon-containing material. The substrate 200 may be a thin substrate obtained by a thinning process. For example, the substrate 200 may be a thin bulk silicon substrate obtained by a thinning process.

The photoelectric conversion element 203 may include a photodiode. Specifically, the photoelectric conversion element 203 may include a first impurity region 201 and a second impurity region 202 having a conductivity type complementary to the first impurity region 201 and contacting with a channel structure 210. The second impurity region 202 may be formed in the first impurity region 201. Thus, the first impurity region 201 may surround the second Impurity region 202, and a portion of the second impurity region 202 may pass through the first impurity region 201 to contact the channel structure 210. The first impurity region 201 may be a P-type, and the second Impurity region 202 may be an N-type. In a vertical direction, the second impurity region 202 may have either a uniform doping profile or a profile in which an impurity concentration is gradually increased according to a carrier transfer direction. In case of the latter, a photocharge generated by a photoelectric conversion element 203 may be more effectively transferred to the transfer gate 208. Here, a carrier transfer direction of the transfer gate 208 is the direction facing the incident surface S1.

The image sensor in accordance with the embodiment of the present invention may include the color filter layer 218 formed over the incident surface S1 of the substrate 200, and the light condensing member 219 formed over the color filter layer 218. The color filter layer 218 may serve to separate colors and include a red filter, a green filter, a blue filter, a cyan filter, a yellow filter, a magenta filter, a white filter, a black filter, an IR cutoff filter, etc. The light condensing member 219 may include a digital lens or a hemispherical lens.

The image sensor in accordance with the embodiment of the present invention may include the transfer gate 208 formed over the photoelectric conversion element 203. The transfer gate 208 formed over the substrate 200 where the photoelectric conversion element 203 is formed may have a flat plate shape and overlap with the photoelectric conversion element 203. That is, the transfer gate 208 may have a flat plate shape and is formed corresponding to each unit pixel. As such, since the photoelectric conversion element 203 and the transfer gate 208 are stacked in a vertical direction, an integration degree may be increased. The transfer gate 208 may be formed over an opposite surface S2 to the incident surface. Accordingly, the transfer gate 208 may function as a back reflective layer with respect to the photoelectric conversion element 203. In this case, the photoelectric conversion element 203 may increase quantum efficiency.

Moreover, the transfer gate 208 may include one or more through hole 207 passing through the transfer gate 208, and have a shape in which the channel structure 210 gap-fills the through hole 207. A planar shape of the through hole 207 may be a polygon having three sides or more, a circle, or ellipse. Therefore, the channel structure 210 gap-filling the through hole 207 may have a polygonal column shape having three sides or more, a circular column shape, a ring-type column shape, or a cylinder shape. As shown in FIG. 2, the transfer gate 208 may have a single through hole 207. In this case, the through hole 207 may be disposed in a central portion of the transfer gate 208. Also, as shown in FIG. 4, the transfer gate 208 may have a plurality of through holes 207, and the plurality of through holes 207 may be disposed in the transfer gate 208 in a matrix shape. A planar shape of each of the plurality of through holes 207 may be the same as or different from each other.

Further, the transfer gate 208 may include a gate electrode 205 and a gate dielectric layer 206 formed on all surfaces of the gate electrode 205 so as to seal the gate electrode 205. That is, the gate electrode 205 may be insulated from adjacent structures such as the photoelectric conversion element 203, the floating diffusion layer 214, etc. by the gate dielectric layer 206. The gate electrode 205 may include a semiconductor material including silicon or a metallic material.

The gate dielectric layer 206 surrounding the gate electrode 205 may have a uniform thickness. That is, a first gate dielectric layer 206A disposed between the photoelectric conversion element 203 and the gate electrode 205, a second gate dielectric layer 206B disposed between the gate electrode 205 and the floating diffusion layer 214, and a third gate dielectric layer 206C formed on sidewalls of the gate electrode 205 may have the same thickness as each other.

And, the first gate dielectric layer 206A, the second gate dielectric layer 206B and the third gate dielectric layer 206C may be formed of the same material as each other. For example, the first gate dielectric layer 206A, the second gate dielectric layer 206B and the third gate dielectric layer 206C may include a high-K material. Herein, 'high-K' means a high dielectric constant than silicon oxide.

The image sensor in accordance with the embodiment of the present invention may include the channel structure 210 passing through the transfer gate 208 and electrically coupled to the photoelectric conversion element 203. The channel structure 210 may gap-fill the through hole 207 of the transfer gate 208. Accordingly, the channel structure 210 may have a column shape. For reference, the channel structure 210 explained with reference to FIGS. 5A to 5C may be applied to other embodiments.

Specifically, as shown in FIGS. 3 and 5A, the channel structure 210 may include a channel layer 211 formed on sidewalls of the through hole 207 and having a ring-type column shape, and a sealing layer 212 gap-filling remaining through hole 207. The channel layer 211 having a ring-type column shape may facilitate implementing a line width capable of full depletion of a channel in an off-state. Thus, it is possible to improve gate controllability of the transfer gate 208. For example, the off-state means an equilibrium state in which any bias is not applied to the transfer gate 208.

Moreover, as shown in FIG. 5B, the channel structure 210 may include the channel layer 211 formed on sidewalls and a bottom surface of the through hole 207 and having a cylinder shape, and the sealing layer 212 gap-filling remaining through hole 207. The channel layer 211 having a cylinder shape may have a line width sufficient for full depletion of a channel in an off-state so that gate controllability of the transfer gate 208 may be improved. Furthermore, an area in which the photoelectric conversion element 203 contacts with the channel layer 211 may be increased so that a channel resistivity may be decreased.

Meanwhile, the channel structure 210 may include the sealing layer 212 spaced from sidewalls of the through hole 207 and formed in the through hole 207 and the channel layer 211 formed on sidewalls and an upper surface of the through hole 207 and having a reversed-cylinder shape. That is, in the channel layer 211, a surface having a relatively large contact area contacts with the floating diffusion layer 214 and a surface having a relatively small contact area contacts with the photoelectric conversion element.

In addition, as shown in FIG. 5C, the channel structure 210 may include the channel layer 211 having a column shape and gap-filling the through hole 207. The channel layer 211 having a column shape may be formed by a simple process and have a line width sufficient for full depletion of a channel in an off-state.

In the channel structure 210 described above, the channel layer 211 may include a silicon-containing material. For example, the channel layer 211 may include polysilicon. Specifically, the channel layer 211 may include undoped polysilicon where an impurity is not doped or a P-type polysilicon where a P-type impurity is doped. In this case, the transfer transistor may be operated in an enhancement mode. Moreover, the channel layer 211 may include polysilicon doped with an N-type impurity. In this case, the transfer transistor may be operated in a depletion mode and improve a dark current characteristic in an off-state. The sealing layer 212 may include an insulating material. For example, the sealing layer 212 may include oxide, nitride, oxynitride, or a combination thereof.

The image sensor in accordance with the embodiment of the present Invention may include the floating diffusion layer 214 formed over the transfer gate 208. A photocharge generated from the photoelectric conversion element 203 in response to an incident light is stored in the floating diffusion layer 214. The floating diffusion layer 214 may be electrically coupled to one or more channel structures 210 passing through the transfer gate 208. That is, the floating diffusion layer 214 may overlap with one or more through holes 207. The floating diffusion layer 214 may have a flat plate shape and overlap with the transfer gate 208 to provide a sufficient storage space, that is, sufficient capacitance. Here, an area of the floating diffusion layer 214 may be smaller than that of the transfer gate 208. This is to provide a space for forming a first contact C1 coupled to the transfer gate 208. The floating diffusion layer 214 may include a semiconductor material including silicon or a metallic material. For example, the floating diffusion layer 214 may include polysilicon doped with a second conductivity type impurity, that is, an N-type impurity.

The image sensor in accordance with the embodiment of the present invention may include a second electrode 216 formed over the floating diffusion layer 214. The second electrode 216 may have a flat plate shape overlapping with the floating diffusion layer 214 and have a smaller area than the floating diffusion layer 214. A dielectric layer 215 is interposed between two electrodes, that is, the floating diffusion layer 214 and a second electrode 216. The floating diffusion layer 214 and the second electrode 216 may also be referred to as first and second electrodes. The floating diffusion layer 214, a second electrode 216, and the dielectric layer 215, in combination, form the capacitor 217. Any one of the two electrodes, for example, the first electrode may include the floating diffusion layer 214. Accordingly, the dielectric layer 215 and the second electrode 216 may have a smaller area than the floating diffusion layer 214. This is to provide a space for forming a second contact C2 coupled to the floating diffusion layer 214.

Moreover, the capacitor 217 may serve to further increase capacitance with respect to the floating diffusion layer 214. Also, the capacitor 217 may serve to improve an operation characteristic with respect to the floating diffusion layer 214. Furthermore, the second electrode 216 of the capacitor 217 may be coupled to a third contact C3 capable of applying a bias. In an embodiment, to improve a characteristic of the floating diffusion layer 214 by using the capacitor 217, when the floating diffusion layer 214 is reset before integration time, the floating diffusion layer 214 should be charged with charges corresponding to an initial voltage input through a reset transistor.

When the initial voltage does not supply a sufficient current or the initial voltage is not supplied to the floating diffusion layer 214 for a sufficient period of time, the floating diffusion layer 214 may not be completely reset. In this case, the floating diffusion layer 214 may be completely reset by applying an initialization voltage to the second electrode 216 of the capacitor 217 through the third contact C3. The initialization voltage may be applied after the reset transistor is activated and before the transfer transistor is activated.

The image sensor in accordance with the embodiment of the present invention may include the interlayer dielectric layer 209 covering a structure, which includes the transfer gate 208, the floating diffusion layer 214, the capacitor 217, and the logic circuit layer 220 formed over the interlayer dielectric layer 209. The interlayer dielectric layer 209 may be a single layer or a stacked layer including any one or more of oxide, nitiride, and oxynitirde.

The logic circuit layer 220 may include a signal processing circuit processing a pixel signal generated in pixels in response to an incident light. Although it is not shown in drawings, the signal processing circuit may include a correlated double sampling 120, an analog-digital converter 130, a buffer 140, a row driver 150, a timing generator 160, a control register 170, a lamp signal generator 180, etc. See FIG. 1. Furthermore, the signal processing circuit may include a plurality of transistors, a multi-layered lines, a multi-layered interlayer dielectric layer 209 and a plurality of plugs coupling them to each other. Moreover, the logic circuit layer 220 may include an application processor (AP) including an image processing, etc. In addition to the signal processing circuit. For example, the logic circuit layer 220 may include an image signal processor (ISP).

Further, the logic circuit layer 220 may be formed in a wafer bonding process. The logic circuit layer 220 is bonded to the multi-layered interlayer dielectric layer 209. Accordingly, the logic circuit layer 220 may include a plurality of layers and have a stack structure in which logic circuits for signal processing are stacked through a wafer bonding process, thereby improving an integration degree of the image sensor.

The image sensor in accordance with the embodiment of the present invention described above may facilitate high integration and prevent deterioration of characteristics due to high integration.

Hereinafter, some modifications of the image sensor in accordance with the first embodiment of the present invention described above will be described with reference to FIGS. 6 and 7. For reference, FIGS. 6 and 7 are cross-sectional views taken along the line A-A' shown in FIG. 2 and the same elements as those of FIG. 3 are assigned the same reference numerals as those of FIG. 3 for convenience.

Figure 6:
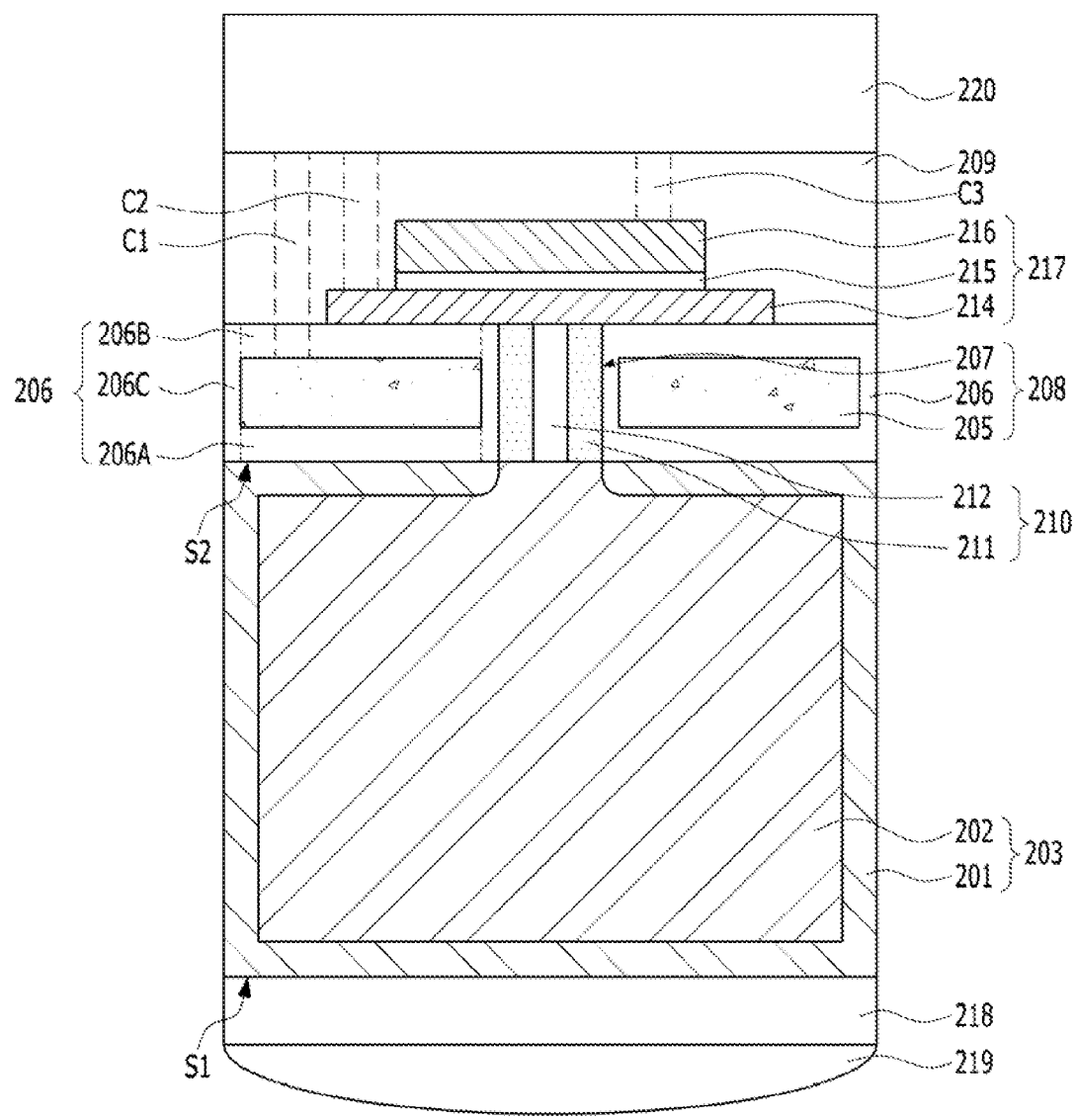
FIG. 6 is a cross-sectional view illustrating an image sensor in accordance with another embodiment of the present invention.
Figure 7:
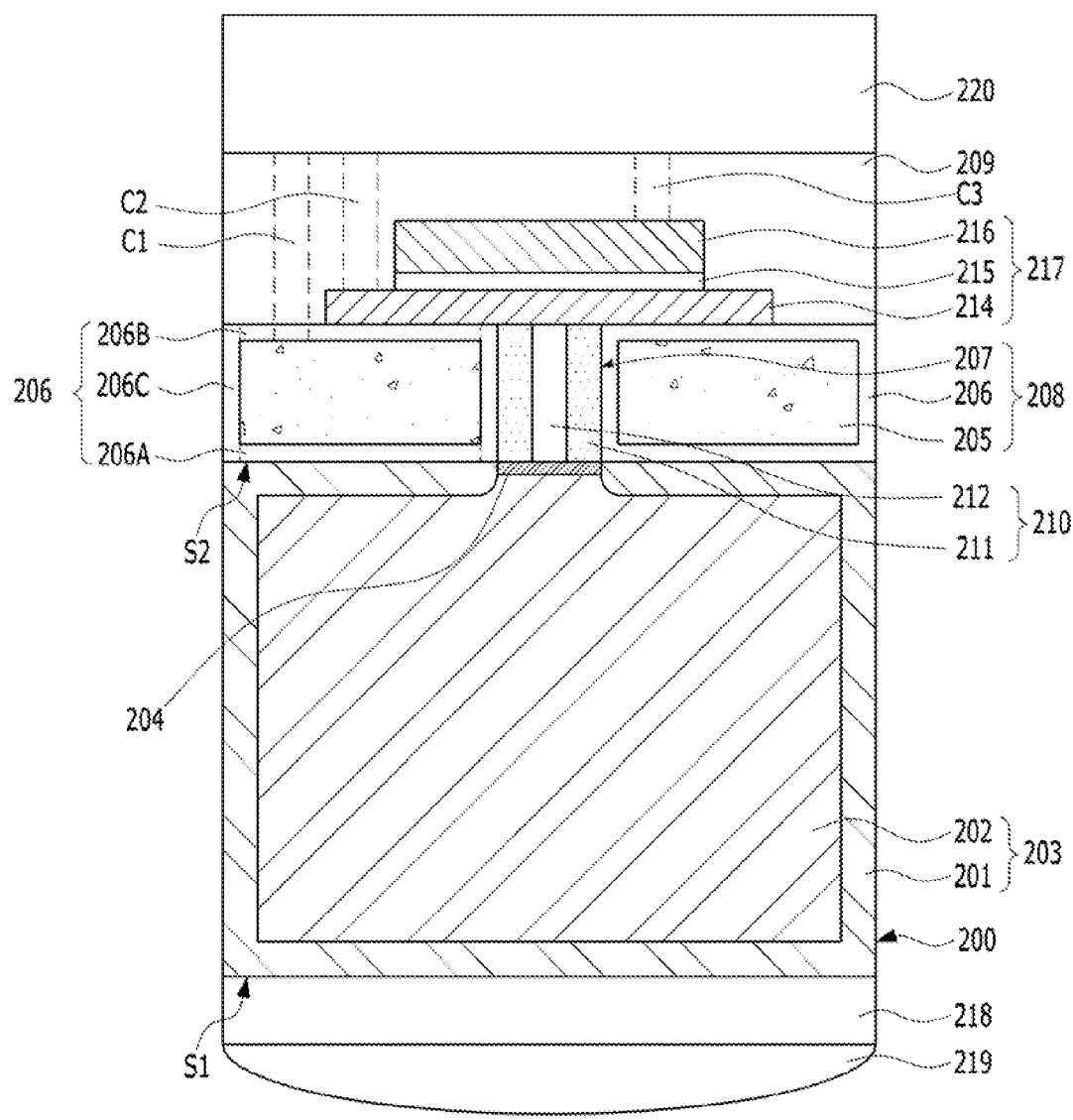
FIG. 7 is a cross-sectional view an image sensor in accordance with yet another embodiment of the present invention.

FIG. 6 is a cross-sectional view illustrating an image sensor in accordance with another embodiment of the present invention. As shown in FIG. 6, in the image sensor in accordance with another embodiment of the present invention, a transfer gate 208 may include a gate dielectric layer 206 and a gate electrode 205 sealed by the gate dielectric layer 206. The gate dielectric layer 206 may include a first gate dielectric layer 206A, a second dielectric layer 2068 and a third gate dielectric layer 206C. Here, the first gate dielectric layer 206A, the second dielectric layer 206B and the third gate dielectric layer 206C may have different thicknesses from each other and include different materials from each other.

Specifically, the first gate dielectric layer 206A and the second gate dielectric layer 206B may have a larger thickness than the third gate dielectric layer 206C. This may improve an electrical insulating characteristic between the gate electrode 205 and adjacent structures. The third gate dielectric layer 206C is usually fixed to a certain thickness since it serves as a gate insulating layer between the gate electrode 205 and the channel structure 210. However, as a thickness of the first gate dielectric layer 206A disposed between the photoelectric conversion element 203 and the gate electrode 205, and a thickness of the second gate dielectric layer 206B between the floating diffusion layer 214 and the gate electrode 205 are increased, an electrical insulating characteristic may be improved. For example, as thicknesses of the first gate dielectric layer 206A and the second gate dielectric layer 206B are increased, a parasitic capacitance therebetween may be decreased, thereby improving a signal to noise ratio characteristic.

Moreover, to further improve an electrical insulating characteristic, the first gate dielectric layer 206A and the second gate dielectric layer 206B may include a low-K material. Herein, 'low-K' means a low dielectric constant than silicon oxide. The third gate dielectric layer 206C contacting with the channel structure 210 may include a high-K material. The image sensor in accordance with another embodiment of the present invention described above may facilitate high integration and prevent deterioration of characteristics due to high integration.

FIG. 7 is a cross-sectional view illustrating an image sensor in accordance with yet another embodiment of the present invention image sensor. As shown in FIG. 7, a photoelectric conversion element 203 of the image sensor in accordance with yet another embodiment of the present invention may include a first impurity region 201 and a second impurity region 202. The first impurity region 201 may surround the second impurity region 202. And, a portion of the second impurity region 202 passes through the first impurity region 201 and contacts with a channel structure 210.

Here, an image sensor in accordance with still yet embodiment of the present invention may further include a third impurity region 204 formed in a substrate 200, having the same conductivity type as the first impurity region 201 and interposed between the second impurity region 202 and the channel structure 210.

Specifically, the third impurity region 204 may be formed in a surface of the substrate 200 contacting the channel structure and serves to suppress generation of a dark current. Here, the first impurity region 201, which contacts an incident surface S1 and an opposite surface S2 of the substrate 200, may also serve to suppress generation of a dark current. In this case, since the third impurity region 204 has a conductivity type complementary to the second impurity region 202, the third impurity region 204 may preferably have a smaller thickness than the first impurity region 201 contacting the opposite surface S2 of the substrate 200 to transfer carriers between the photoelectric conversion element 203 and the channel structure 210. For example, the third impurity region 204 may have a thickness of 50 nm or less. The image sensor in accordance with yet another embodiment of the present invention described above may facilitate high integration and prevent deterioration of characteristics due to high integration.

Hereinafter, an example of a method for fabricating an image sensor in accordance with an embodiment of the present invention, that is, the image sensor shown in FIG. 3 will be described with reference to drawings.

Figure 8A:
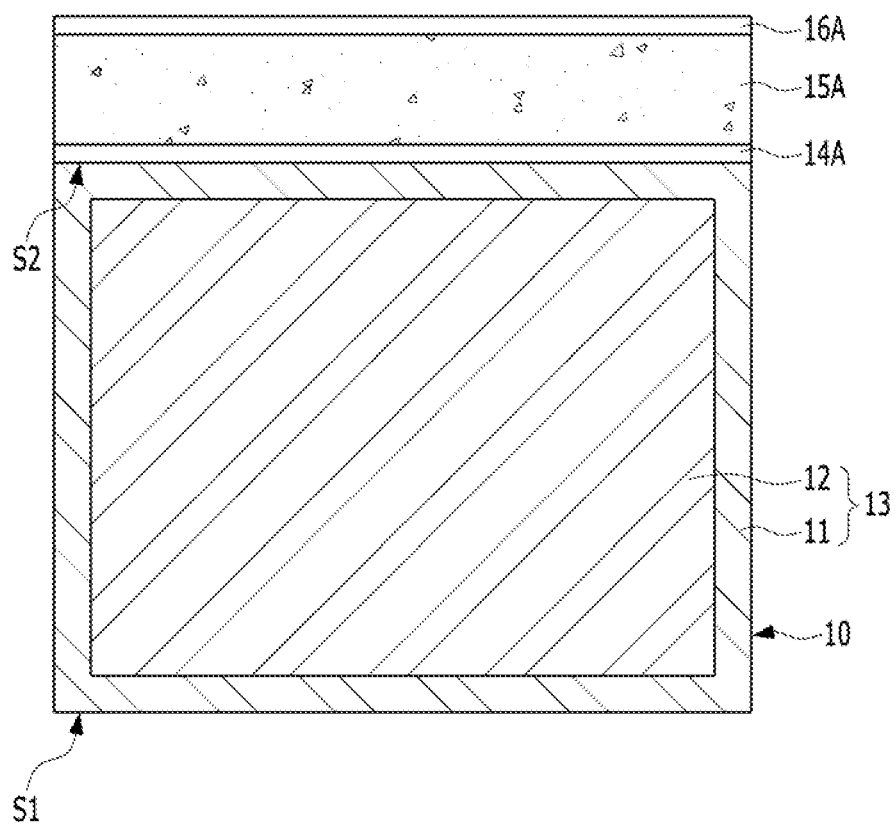
FIGS. 8A to 8F are cross-sectional views illustrating a method for fabricating an image sensor in accordance with an embodiment of the present invention.

FIGS. 8A to 8F are cross-sectional views illustrating a method for fabricating an image sensor in accordance with an embodiment of the present invention. As shown in FIG. 8A, a photoelectric conversion element 13 may be formed in a substrate 10. The substrate 10 may include a semiconductor substrate. The semiconductor substrate may be in a single crystal state and include a silicon-containing material.

The photoelectric conversion element 13 may include a first impurity region 11 and a second impurity region 12 having a conductivity type complementary to the first impurity region 11. The first impurity region 11 may be formed to have a shape surrounding the second impurity region 12. Here, the first impurity region 11 may have P-type conductivity, and the second impurity region 12 may have N-type conductivity. The photoelectric conversion element 13 may be formed to have a shape in which the first impurity region 11 surrounds the second impurity region 12 by doping a rim of the substrate 10 with a P-type impurity to form the first impurity region 11, and implanting an N-type impurity in the second impurity region 12.

Then, a multilayer in which a first dielectric layer 14A, a gate conductive layer 15A, and a second dielectric layer 16A are sequentially stacked may be formed over a surface S2 opposite to an incident surface S1, that is, an opposite surface S2.

Figure 8B:
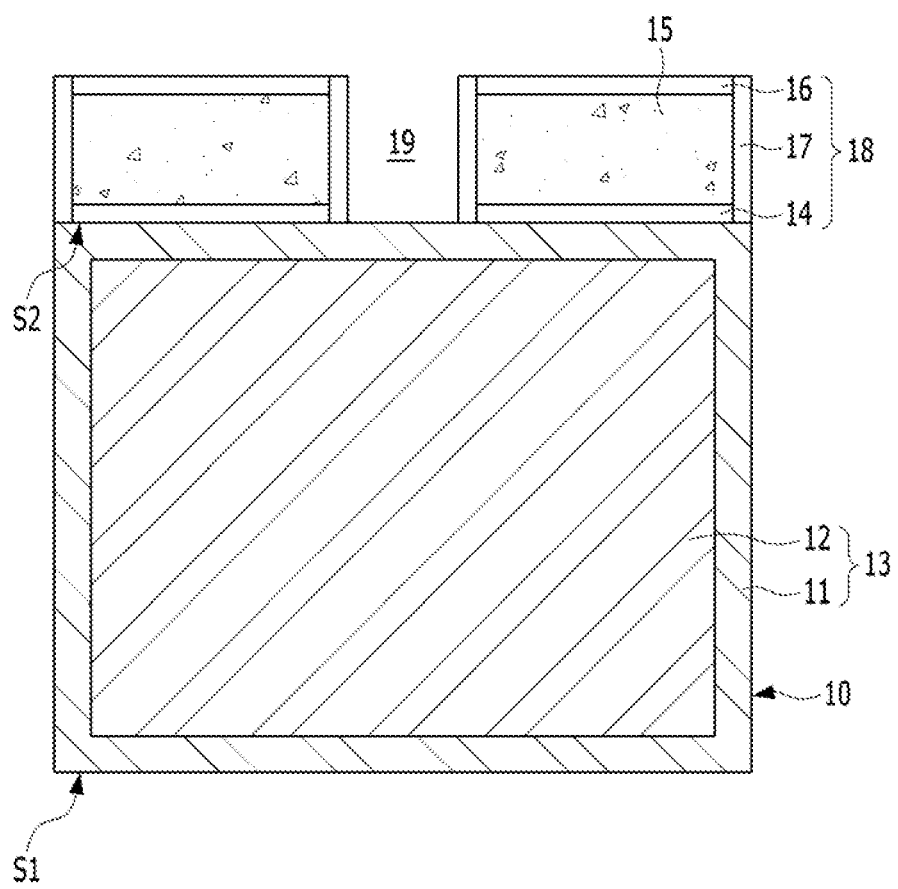

As shown in FIG. 8B, a pattern may be formed by selectively etching the multilayer in which the first dielectric layer 14A, the gate conductive layer 15A and the second dielectric layer 16A are sequentially stacked. Thus, a pattern in which a first gate dielectric layer 14, a gate electrode 15 and a second gate dielectric layer 16 are sequentially stacked may be formed. Here, the pattern may have one or more through holes 19 exposing the photoelectric conversion element 13.

Then, a third gate dielectric layer 17 may be formed on sidewalls of the pattern by forming a third dielectric layer along a surface of a structure including the pattern that includes the one or more through holes 19, and then performing a blanket etch process with respect to the third dielectric layer, for example, an etch-back process. A thickness of the third gate dielectric layer 17 may be the same as or smaller than a thickness of the first gate dielectric layer 14 and a thickness of the second gate dielectric layer 16. Moreover, the third gate dielectric layer 17 may be formed of a material identical to or different from the first gate dielectric layer 14 and the second gate dielectric layer 16.

Thus, a gate dielectric layer 18 including the first gate dielectric layer 14, the second dielectric layer 16 and the third gate dielectric layer 17 may be formed over the opposite surface S2 of the substrate 10. And, a transfer gate 20 including the gate electrode 15 sealed by the gate dielectric layer 18 and the one or more through holes 19 may be formed.

Figure 8C:
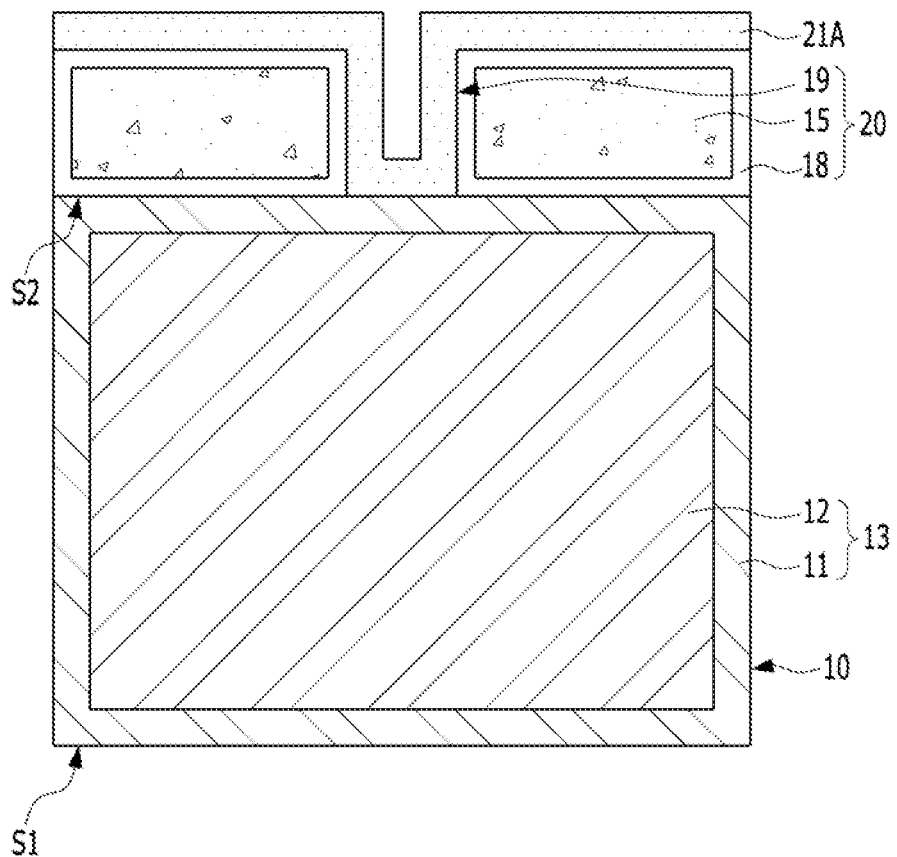

As shown in FIG. 8C, a portion of the second impurity region 12 may be expanded and exposed over a surface of the substrate 10 by ion implanting an N-type impurity in the first impurity region 11 of the substrate 10 exposed by the through holes 19. That is, a portion of the second impurity region 12 may pass through the first impurity region 11 to contact a bottom surface of the through holes 19.

Then, a channel conductive layer 21A may be formed along a surface of a structure including the transfer gate 20. Here, the channel conductive layer 21A may be formed to gap-fill a portion of the through holes 19 or completely gap-fill the through holes 19. According to a method for forming the channel conductive layer 21A, a shape of a channel layer, which will be formed through subsequent processes, may vary. For example, when the channel conductive layer 21A gap-fills a portion of the through holes 19, a channel layer having a ring-type column shape or a cylinder shape may be formed. When the channel conductive layer 21A completely gap-fills the through holes 19, a channel layer having a column shape may be formed. The channel conductive layer 21A may include a silicon-containing material. For example, the channel conductive layer 21A may include polysilicon. The polysilicon may be undoped polysilicon which is not doped with an impurity.

Furthermore, although it is not shown in drawings, before forming the channel conductive layer 21A, the third impurity region may be formed by implanting a P-type impurity in a surface of the substrate exposed through the through holes 19, that is, expanded second impurity region 12. The third impurity region may serve to prevent generation of a dark current.

Figure 8D:
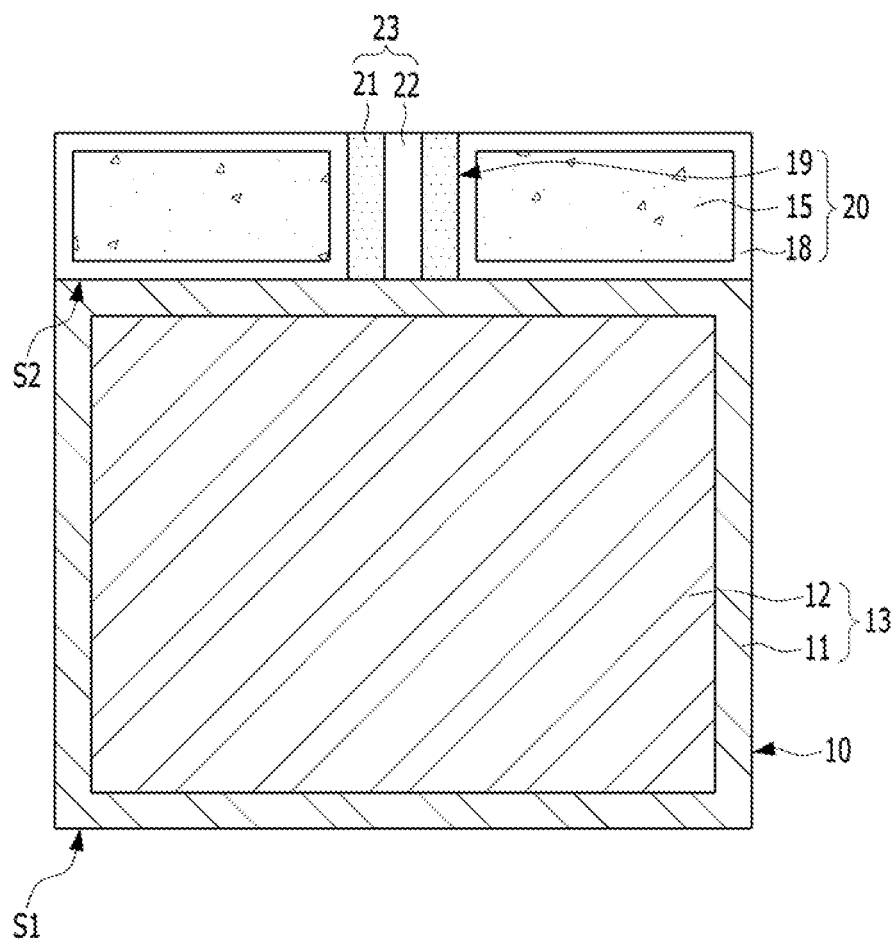

As shown in FIG. 8D, a channel layer 21 having a ring-type column shape may be formed by performing a blanket etch process with respect to the channel conductive layer 21A. Subsequently, a sealing layer 22 may be formed to gap-fill the remaining through holes 19. The sealing layer 22 may include an insulating material and be formed by deposition and planarization processes.

Thus, a channel structure 23 including the channel layer 21 and the sealing layer 22 and passing through the transfer gate 20 to contact the photoelectric conversion element 13 may be formed.

Figure 8E:
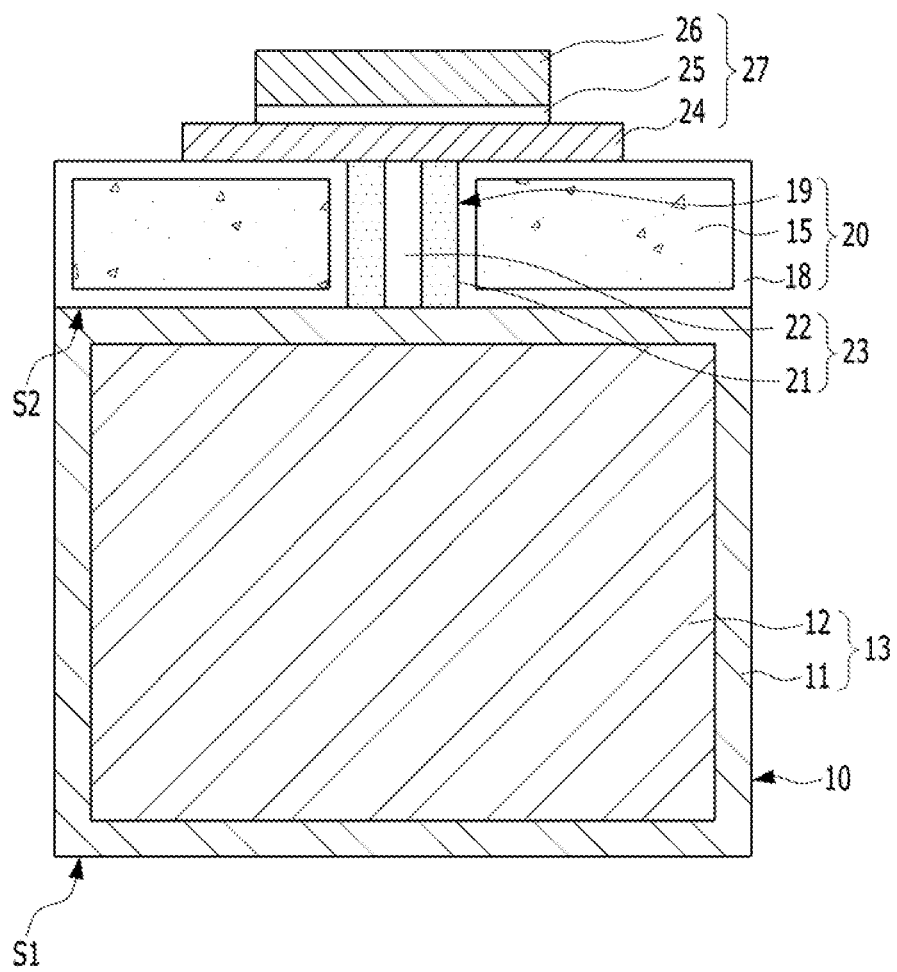

As shown in FIG. 8E, a floating diffusion layer 24 may be formed over the transfer gate 20 and over the channel structure 23. The floating diffusion layer 24 may have a flat plate shape and a smaller area than the transfer gate 20. Moreover, the floating diffusion layer 24 may overlap with the channel structure 23 passing through the transfer gate 20. That is, when the plurality of channel structures 23 pass through the transfer gate 20, the floating diffusion layer 24 may be formed to overlap all of the plurality of channel structures 23. The floating diffusion layer 24 may include a semiconductor material including silicon or a metallic material. For example, the floating diffusion layer 24 may include polysilicon doped with an N-type impurity.

Then, a capacitor 27 may be formed over the floating diffusion layer 24. The capacitor 27 may be formed as a stack structure in which a first electrode, a dielectric layer 25 and a second electrode 26 are sequentially stacked. Here, the first electrode may be the floating diffusion layer 24. The capacitor 27 may have a flat shape and a smaller area than the floating diffusion layer 24. Accordingly, the dielectric layer 25 and the second electrode 26 may have a smaller area than the floating diffusion layer 24.

Figure 8F:
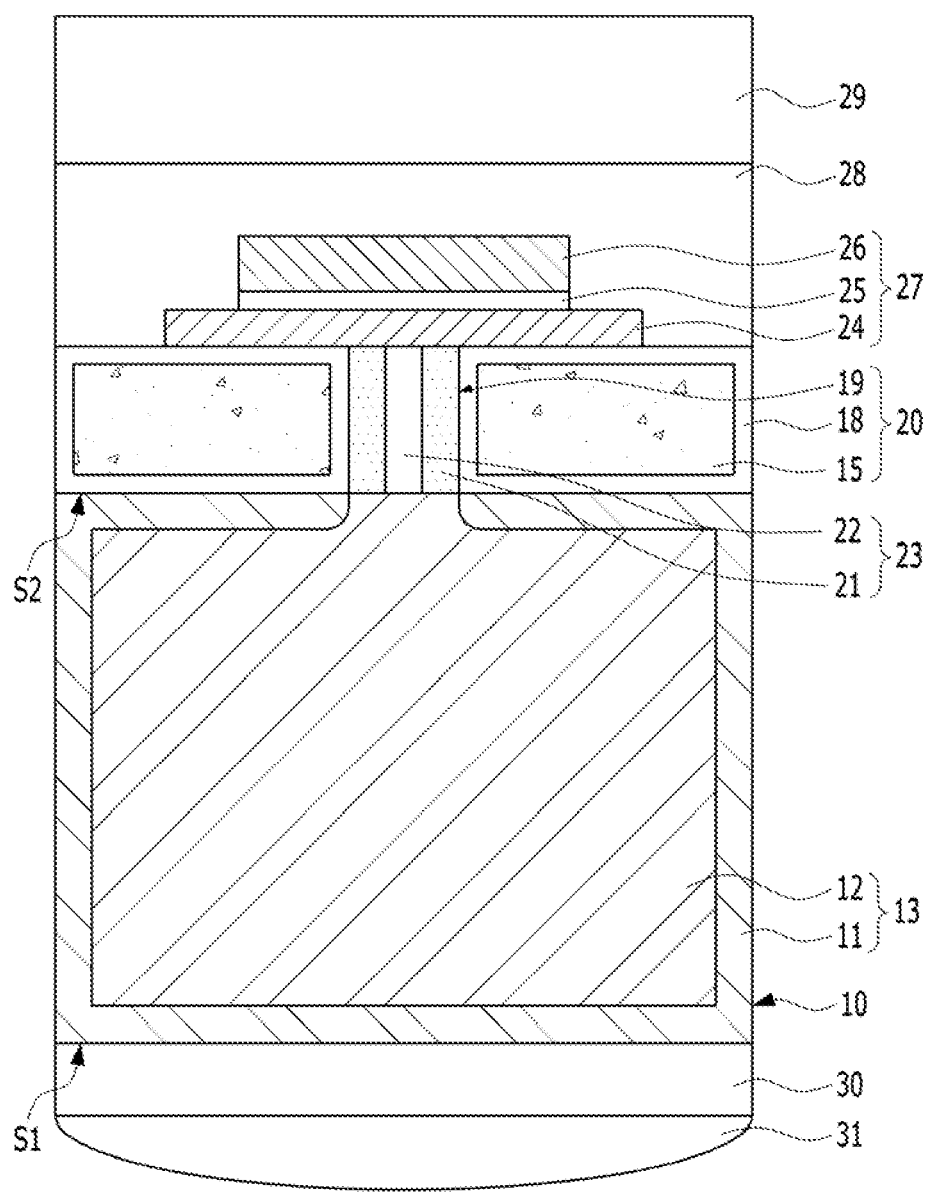

As shown in FIG. 8F, an interlayer dielectric layer 28 covering a structure including the transfer gate 20, the floating diffusion layer 24 and the capacitor 27 may be formed. The interlayer dielectric layer 28 may include oxide, nitride, oxynitride, or a combination thereof.

After forming a logic circuit layer 29 over a carrier wafer (not shown), the Interlayer dielectric layer 28 and the logic circuit layer 29 may be bonded together to face each other. The logic circuit layer 29 may include a signal processing circuit processing a pixel signal generated by pixels in response to an incident light. Although it is not shown in FIG. 8F, the signal processing circuit may include a correlated double sampling 120, an analog-digital converter 130, a buffer 140, a row driver 150, a timing generator 160, a control register 170, a lamp signal generator 180, etc. See FIG. 1. The signal processing circuit may include a plurality of transistors, a multi-layered line, a multi-layered interlayer dielectric layer 28, and a plurality of plugs coupling them to each other.

The logic circuit layer 29 may be formed in a multi-layered structure by performing a plurality of wafer bonding processes, and each logic circuit layer 29 may perform different functions from each other.

Although it is not shown in drawings, before bonding the logic circuit layer 29, a plurality of contacts passing through the interlayer dielectric layer 28 and respectively coupled to the transfer gate 20, the floating diffusion layer 24 and the second electrode 26 of the capacitor 27 may be formed. The plurality of contacts may be coupled to the logic circuit layer 29.

Then, a color filter layer 30 and a light condensing member 31 may sequentially formed over an incident surface S1 of the substrate 10. The color filter layer 30 may serve to separate colors and include a red filter, a green filter, a blue filter, a cyan filter, a yellow filter, a magenta filter, a white filter, a black filter, an IR cutoff filter, etc. The light condensing member 31 may include a digital lens or a hemispherical lens. Subsequently, the image sensor in accordance with the embodiment of the present invention may be completely formed through known technologies for fabricating an image sensor.

The image sensor in accordance with an embodiment of the present invention may be used in various electronic devices or systems. Hereafter, the image sensor in accordance with an embodiment of the present invention which is applied to a camera will be described with reference to FIG. 9.

Figure 9:
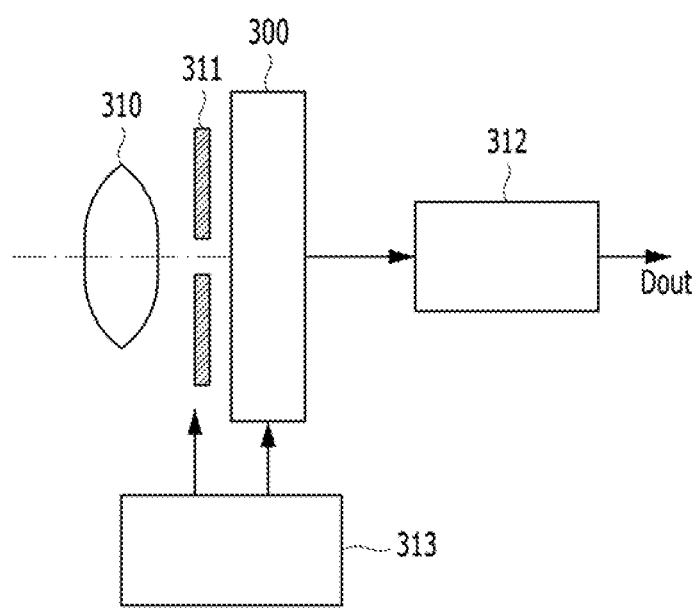
FIG. 9 is a diagram schematically illustrating an electronic device including an image sensor shown in FIG. 1.

FIG. 9 is a diagram schematically illustrating an electronic device including an image sensor shown in FIG. 1. Referring to FIG. 9, the electronic device including the image sensor in accordance with an embodiment of the present invention may be a camera capable of taking a still image or moving image. The electronic device may include an optical system or optical lens 310, a shutter unit 311, a driving unit 313 for controlling/driving the image sensor 300 and the shutter unit 311, and a signal processing unit 312.

The optical system 310 may guide image light from an object to the pixel array 100 of the image sensor 300. The optical system 310 may include a plurality of optical lenses. The shutter unit 311 may control the light irradiation period and the light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium such as a memory or outputted to a monitor or the like.

As described above, the Image sensor can facilitate high integration and preventing deterioration due to an increase in integration.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a photoelectric conversion element formed in a substrate;
a transfer gate formed over the photoelectric conversion element, formed over a first surface of the substrate, and having at least one through hole, wherein the through hole passes through the transfer gate;
a floating diffusion layer formed over the transfer gate;
a channel structure formed in the through hole and electrically coupling the photoelectric conversion element to the floating diffusion layer in response to a signal applied to the transfer gate; and
a capacitor formed over the floating diffusion layer.

2. The image sensor of claim 1, further comprising:
an interlayer dielectric layer formed over the substrate and covering the transfer gate, the floating diffusion layer, and the capacitor;
a logic circuit layer formed over the interlayer dielectric layer; and
contacts passing through the Interlayer dielectric layer and electrically coupling the transfer gate, the floating diffusion layer, and the capacitor to the logic circuit layer, respectively.

3. The image sensor of claim 1, further comprising:
a color filter layer formed over an incident surface of the substrate, wherein the Incident surface of the substrate is opposite to the first surface of the substrate, wherein an incident light is introduced into the photoelectric conversion element through the incident surface; and
a light condensing member formed over the color filter layer.

4. The image sensor of claim 1, wherein the photoelectric conversion element comprises:
a second impurity region formed in the substrate; and
a first impurity region having a conductivity type complementary to the second impurity region, formed in the substrate, and surrounding the second impurity region, wherein the second impurity region extends to the channel structure by passing through the first impurity region.

5. The image sensor of claim 4, wherein the photoelectric conversion element further comprises:
a third impurity region formed in the substrate, having the same conductive type as the first impurity region, and interposed between the channel structure and the second impurity region.

6. The image sensor of claim 5, wherein the first impurity region includes a portion provided between the second impurity region with the transfer gate, and
wherein the third impurity region has a smaller thickness than the portion of the first impurity region which is provided between the second impurity region with the transfer gate.

7. The image sensor of claim 4, wherein a doping concentration of the second impurity region increases along a carrier transfer direction.

8. The image sensor of claim 1, wherein the transfer gate comprises:
a gate electrode; and
a gate dielectric layer surrounding the gate electrode.

9. The image sensor of claim 8, wherein the gate dielectric layer comprises:
a first gate dielectric layer formed between the gate electrode and the photoelectric conversion element;
a second gate dielectric layer formed between the gate electrode and the floating diffusion layer; and
a third gate dielectric layer formed between the channel structure and the gate electrode.

10. The image sensor of claim 9, wherein the first gate dielectric layer, the second gate dielectric layer, and the third gate dielectric layer have the same thickness as each other.

11. The Image sensor of claim 9, wherein each of the first gate dielectric layer and the second gate dielectric layer has a larger thickness than the third gate dielectric layer.

12. The image sensor of claim 11, wherein each of the first gate dielectric layer and the second gate dielectric layer comprises a low-K material, and
wherein the third gate dielectric layer comprises a high-K material.

13. The image sensor of claim 1, wherein the channel structure comprises:
a channel layer formed over a sidewall of the through hole; and
a sealing layer surrounded by through hole.

14. The image sensor of claim 13, wherein the through hole has a polygon pillar shape or a round pillar shape.

15. The image sensor of claim 13, wherein the channel layer has a ring-type column shape or a cylinder shape.

16. The image sensor of claim 1, wherein the channel structure comprises a channel layer having a column shape and is formed so as to fill the through hole completely.

17. The image sensor of claim 1, wherein each of the transfer gate and the floating diffusion layer has a flat plate shape, and
wherein the transfer gate has a larger area than the floating diffusion layer.

18. The image sensor of claim 17, further comprising:
a second through hole,
wherein the second through hole passes through the transfer gate, and
wherein the floating diffusion layer overlaps the through hole.

19. The image sensor of claim 1, wherein the capacitor includes a stack of a first electrode, a dielectric layer, and a second electrode, and
wherein the first electrode comprises the floating diffusion layer.

20. The image sensor of claim 19, wherein each of the floating diffusion layer and the capacitor has a flat plate shape, and
wherein the floating diffusion layer has a larger area than the dielectric layer and the second electrode.

* * * * *